(12) United States Patent
Honda et al.

(10) Patent No.: US 9,045,819 B2
(45) Date of Patent: Jun. 2, 2015

(54) METHOD FOR FORMING THIN FILM WHILE PROVIDING COOLING GAS TO REAR SURFACE OF SUBSTRATE

(75) Inventors: Kazuyoshi Honda, Osaka (JP);
Yasuharu Shinokawa, Osaka (JP);
Hiromasa Yagi, Osaka (JP); Satoshi Shibutani, Osaka (JP); Sadayuki Okazaki, Osaka (JP); Yuko Ogawa, Osaka (JP); Daisuke Suetsugu, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 901 days.

(21) Appl. No.: 13/132,023

(22) PCT Filed: Dec. 10, 2009

(86) PCT No.: PCT/JP2009/006741
§ 371 (c)(1),
(2), (4) Date: Aug. 4, 2011

(87) PCT Pub. No.: WO2010/067603
PCT Pub. Date: Jun. 17, 2010

(65) Prior Publication Data
US 2011/0281029 A1 Nov. 17, 2011

(30) Foreign Application Priority Data
Dec. 10, 2008 (JP) .................. 2008-314025

(51) Int. Cl.
| C23C 14/24 | (2006.01) |
| C23C 14/04 | (2006.01) |
| C23C 14/14 | (2006.01) |
| C23C 14/54 | (2006.01) |
| C23C 14/56 | (2006.01) |

(52) U.S. Cl.
CPC ............ *C23C 14/042* (2013.01); *C23C 14/243* (2013.01); *C23C 14/14* (2013.01); *C23C 14/24* (2013.01); *C23C 14/541* (2013.01); *C23C 14/562* (2013.01)

(58) Field of Classification Search
CPC .... C23C 14/541; C23C 14/562; C23C 14/568
See application file for complete search history.

(56) References Cited

U.S. PATENT DOCUMENTS

| 4,428,980 | A | * | 1/1984 | Nakamura et al. ............ 427/162 |
| 2005/0008778 | A1 | * | 1/2005 | Utsugi et al. ............... 427/248.1 |
| 2010/0272901 | A1 | | 10/2010 | Shinokawa et al. |

FOREIGN PATENT DOCUMENTS

| EP | 0 311 302 | 4/1989 |
| JP | 6-145982 | 5/1994 |

(Continued)

OTHER PUBLICATIONS

Machine Translation of JP 2005054212 A.*
Machine Translation of JP 2006089782 A.*

*Primary Examiner* — David Turocy
(74) *Attorney, Agent, or Firm* — McDermott Will & Emery LLP

(57) ABSTRACT

Deterioration of the degree of vacuum in a vacuum chamber is prevented while securing adequate cooling performance by gas cooling. A substrate 21 is provided in a vacuum, and the cooling body 1 is provided close to a film non-formation surface of the substrate 21. A thin film is formed by depositing a film forming material on a film formation surface of the substrate 21 while introducing a cooling gas into between the substrate 21 and the cooling body 1. At this time, a gas which reacts with the film forming material is introduced as the cooling gas.

12 Claims, 8 Drawing Sheets

(56) References Cited

FOREIGN PATENT DOCUMENTS

| JP | 4369531 | 9/2000 |
| JP | 2005-054212 | 3/2005 |
| JP | 2005054212 A * | 3/2005 |
| JP | 2006089782 A * | 4/2006 |

* cited by examiner

METHOD FOR FORMING THIN FILM WHILE PROVIDING COOLING GAS TO REAR SURFACE OF SUBSTRATE

RELATED APPLICATIONS

This application is the U.S. National Phase under 35 U.S.C. §371 of International Application No. PCT/JP2009/006741, filed on Dec. 10, 2009, which in turn claims the benefit of Japanese Application No. 2008-314025, filed on Dec. 10, 2008, the disclosures of which Applications are incorporated by reference herein.

TECHNICAL FIELD

The present invention relates to a method for forming a thin film.

BACKGROUND ART

In recent years, a thin film technology is widely used to enhance device performances and reduce device sizes. Realizing thin-film devices brings direct merits to users, and in addition, plays an important role from an environmental point of view, such as protection of earth resources and a reduction in power consumption. For the development of the thin film technology, it is essential to respond to demands from industrial aspects, such as increases in efficiency, stability, and productivity of thin film formation and a reduction in cost of the thin film formation. Especially, in order to realize the increase in productivity of the thin film formation, a high-deposition-rate film forming technology is essential. In the film forming method, such as vacuum deposition, sputtering, ion plating, and CVD, an increase in deposition rate is being promoted.

Generally used as a method for continuously mass-producing the thin film is a take-up type thin film forming method. The take-up type thin film forming method is a method for pulling out an elongated substrate, rolled around a pull-out roll, to a transfer system, forming a thin film on the substrate travelling in a transfer process, and taking up the substrate by a take-up roll. By combining the take-up type thin film forming method with, for example, a high-deposition-rate film forming method, such as vacuum deposition using an electron beam, the thin film can be continuously mass-produced with high productivity.

However, in a case where the take-up type thin film forming method and the vacuum deposition are combined as above, radiation heat from an evaporation source and heat energy of deposition particles are applied to the substrate. This increases the temperature of the substrate to cause the deformation, meltdown, or the like of the substrate. Moreover, even in a case where the take-up type thin film forming method is combined with the other film forming method whose heat source is different from the above, heat load is applied to the substrate during the film formation. To prevent the deformation, meltdown, or the like of the substrate by such heat load, the substrate needs to be cooled down in the take-up type thin film forming method.

Widely used as a method for cooling down the substrate is a method for providing the substrate along a cylindrical can disposed on a passage of the transfer system and transferring the heat of the substrate to the cylindrical can. In accordance with this cooling method, by securing thermal contact between the substrate and the cylindrical can, the heat of the substrate can be transferred to the cylindrical can having a high heat capacity. With this, the temperature increase of the substrate can be suppressed, and the temperature of the substrate can be kept at a specific temperature. Reported is that, for example, a gas cooling method for introducing a gas into between the substrate and the cylindrical can is used under a vacuum atmosphere (see PTL 1, for example). In accordance with this method, the thermal contact between the substrate and the cylindrical can can be secured via the gas, and the temperature increase of the substrate can be suppressed.

Instead of the cylindrical can, a cooling belt may be used as means for cooling down the substrate. For example, in the case of the thin film forming method by oblique incidence, forming the film with the substrate moving linearly is advantageous from a viewpoint of the use efficiency of a film forming material. In this case, it is effective to use the cooling belt as the substrate cooling means. In a thin film forming device using a belt for transferring and cooling a substrate material, another cooling belt is further provided inside the cooling belt, or a cooling mechanism using a liquid cooling medium is provided inside the cooling belt. With this, cooling efficiency can be improved, and the temperature increase of the substrate material can be suppressed (see PTL 2, for example).

CITATION LIST

Patent Literature

PTL 1: Japanese Laid-Open Patent Application Publication No. 1-152262

PTL 2: Japanese Laid-Open Patent Application Publication No. 6-145982

SUMMARY OF INVENTION

Technical Problem

To improve the productivity in the thin film formation, it is necessary to carry out the film formation at a high film formation rate and improve the cooling efficiency. For example, to increase the cooling efficiency in the gas cooling under the vacuum atmosphere, it is effective to increase the pressure between a cooling body and the substrate. Therefore, it is necessary to narrow the gap between the cooling body and the substrate as much as possible and increase the introduction amount of cooling gas.

However, in a case where the amount of gas introduced into the vacuum chamber is increased, the degree of vacuum deteriorates (the atmospheric pressure in the vacuum chamber increases) by the cooling gas leaking from between the cooling body and the substrate, and this causes the deterioration of the film quality, abnormal discharge of a process, and the like. Therefore, the amount of gas introduced into the vacuum chamber is limited. Moreover, increasing the introduction amount of gas requires the increase in size of an exhaust pump, and this increases a facility cost.

The present invention was made to solve the above problems, and an object of the present invention is to provide a thin film forming method for realizing gas cooling at a low cost by simple facilities while suppressing the deterioration of the degree of vacuum and the reduction in quality of the thin film, the gas cooling being necessary to carry out the film formation at a high film formation rate.

Solution to Problem

To solve the above conventional problems, a thin film forming method of the present invention is a method for depositing a film forming material in a vacuum on a substrate having a front surface and a rear surface to form a thin film, the method including: a first providing step of providing a first cooling surface in a first thin film forming region such that the first cooling surface is close to the rear surface; a first thin film forming step of forming the thin film on the front surface of the substrate and in the first thin film forming region; and a first cooling step of cooling down the substrate by introducing a cooling gas into between the first cooling surface and the rear surface during the first thin film forming step, the cooling gas containing a gas (hereinafter may be referred to as a "reactive gas") which reacts with the film forming material. With this, even if the cooling gas leaks from between the cooling body and the substrate, all or a part of the reactive gas contained in the leaked cooling gas reacts with, for example, the vapor of the film forming material contained in the vacuum chamber. With this, a part or all of the reactive gas in the cooling gas is removed in a film forming atmosphere. Therefore, a ratio of the reactive gas to the unreactive gas in the film forming atmosphere becomes lower than that between the cooling body and the rear surface of the substrate. On this account, the deterioration of the degree of vacuum in the film forming atmosphere due to the introduction of the cooling gas can be suppressed.

In accordance with the thin film forming method of the present invention, a one-layer thin film can be formed on the front surface by carrying out the first thin film forming step once. Moreover, by carrying out the first thin film forming step plural times with respect to a predetermined portion of the front surface, a multi-layer thin film can be formed on the predetermined portion. When forming the multi-layer thin film, it is preferable that the reactive gas introduced when forming a first layer of the thin film be smaller in amount than the reactive gas introduced when forming a second layer of the thin film. As described below, the amount of reactive gas introduced when forming the first layer of the thin film may be zero. With this, the reaction between the substrate exposed before forming the thin film and the reactive gas can be prevented when forming the first layer of the thin film. If the substrate reacts with the reactive gas, the front surface of the substrate may change in color, or the strength of the substrate may deteriorate.

It is further preferable that: during the first thin film forming step of forming the first layer of the thin film, the cooling gas be not introduced into between the first cooling surface and the rear surface, or the cooling gas mainly containing a gas (hereinafter may be referred to as an "unreactive gas") which does not react with the film forming material be introduced into between the first cooling surface and the rear surface; and during the first thin film forming step of forming the second and subsequent layers of the thin film, the first cooling step be carried out. With this, the direct contact between the substrate exposed before forming the thin film and the reactive gas can be avoided when forming the first layer of the thin film. If the substrate and the reactive gas contact each other in a case where the substrate has a property of reacting with the reactive gas (especially in a case where the substrate is a metal foil), they reacts with each other (the substrate oxidizes if the reactive gas contains oxygen), and the substrate deteriorates. However, in accordance with the above method, the deterioration of the substrate is avoidable. When forming the second and subsequent layers of the thin film, the front surface of the substrate is already covered with the first layer of the thin film. Therefore, the front surface of the substrate and the reactive gas do not contact. On this account, the reactive gas can be introduced without causing the deterioration of the substrate.

The cooling gas mainly containing the unreactive gas is preferably constituted by only the unreactive gas but may be a mixture of the unreactive gas and the reactive gas. In the latter case, the cooling gas may contain a small amount of reactive gas, like an impurity gas. For example, the cooling gas mainly containing the unreactive gas contains the unreactive gas at more than 95 volume %, preferably 99 volume % or higher, and further preferably 99.9 volume % or higher, and the rest is the reactive gas.

In the thin film forming method of the present invention, the thin film is formed on the front surface of the substrate by the above steps. However, the thin film can also be formed on the rear surface of the substrate by carrying out the same steps as above with respect to the rear surface of the substrate. To be specific, the thin film forming method of the present invention further includes: a second providing step of providing a second cooling surface in a second thin film forming region such that the second cooling surface is close to the front surface; a second thin film forming step of forming the thin film on the rear surface of the substrate and in the second thin film forming region; and a second cooling step of cooling down the substrate by introducing the cooling gas into between the second cooling surface and the front surface during the second thin film forming step, the cooling gas containing the gas which reacts with the film forming material, and with this, the thin film can be formed on each of both surfaces of the substrate.

Moreover, by carrying out the first thin film forming step and the second thin film forming step plural times, the multi-layer thin film can be formed on each of both surfaces of the substrate. When forming the multi-layer thin film, it is preferable that the reactive gas introduced when forming the first layer of the thin film be smaller in amount than the reactive gas introduced when forming the second layer of the thin film. With this, the reaction between the substrate exposed before forming the thin film and the reactive gas can be suppressed when forming the first layer of the thin film. If the substrate reacts with the reactive gas, the front surface of the substrate may change in color, and the strength of the substrate may deteriorate.

It is further preferable that: during the first thin film forming step of forming the first layer of the thin film on the front surface, the cooling gas be not introduced into between the first cooling surface and the rear surface, or the cooling gas containing only the gas which does not react with the film forming material be introduced into between the first cooling surface and the rear surface; during the second thin film forming step of forming the first layer of the thin film on the rear surface, the cooling gas be not introduced into between the second cooling surface and the front surface, or the cooling gas mainly containing the gas which does not react with the film forming material be introduced into between the second cooling surface and the front surface; after the formation of the first layer of the thin film on each of both surfaces of the substrate and during the first thin film forming step of forming the second and subsequent layers of the thin film on the front surface, the first cooling step be carried out; and during the first thin film forming step of forming the second and subsequent layers of the thin film on the rear surface, the second cooling step be carried out. In accordance with this method, since each of both surfaces of the substrate is covered with the first layer of the thin film when introducing the reactive gas as the cooling gas, the deterioration of the substrate due to the contact with the reactive gas can be surely avoided.

In the thin film forming method of the present invention, the metal foil may be used as the substrate. In accordance with the present invention, even if the metal foil that is a material having high reactivity is used, the deterioration of the substrate due to the introduction of the reactive gas as the cooling gas can be avoided.

The reactive gas is not especially limited as long as it reacts with the film forming material. Specifically, examples are an oxygen gas and a nitrogen gas. Moreover, although each of the hydrocarbon gas and the hydrogen gas does not normally react with the film forming material, it may react with the film forming material under special conditions, such as an atmosphere in which plasma is generated. The reactive gas containing oxygen is preferable. The oxygen easily reacts with the film forming material. The oxygen is removed by reacting with the vapor of the film forming material. Therefore, the deterioration of the degree of vacuum due to the introduction of the cooling gas can be suppressed most efficiently. In the case of introducing the reactive gas as the cooling gas, only the reactive gas may be introduced, or a mixture of the reactive gas and the unreactive gas may be introduced. Moreover, since the oxygen is highly reactive with the metal foil, the substrate easily deteriorates. Therefore, it is significant that the deterioration of the substrate is avoided by using the present invention. The unreactive gas is not especially limited. In addition to the above-described hydrocarbon gas and hydrogen gas, examples of the unreactive gas are a carbon dioxide gas, an argon gas, a helium gas, a neon gas, a xenon gas, and a krypton gas.

In the thin film forming method of the present invention, when forming the above-described multi-layer thin film, it is preferable that a total amount of the cooling gas introduced when forming the first layer of the thin film be smaller than a total amount of the cooling gas introduced when forming any one of the second and subsequent layers of the thin film. If only the unreactive gas is introduced as the cooling gas when forming the first layer of the thin film, the floating vapor of the film forming material and the cooling gas does not react with each other, and the cooling gas is not removed. Therefore, the degree of vacuum tends to deteriorate. To avoid this, the total amount of the cooling gas introduced when forming the first layer of the thin film is reduced, and the total amount of the cooling gas introduced when forming each of the second and subsequent layers of the thin film is comparatively increased. With this, the cooling performance can be secured while avoiding the deterioration of the degree of vacuum.

In the thin film forming method of the present invention, when forming the multi-layer thin film as above, it is preferable that a film deposition rate when forming the first layer of the thin film be lower than the film deposition rate when forming any one of the second and subsequent layers of the thin film. In a case where the cooling gas is not introduced when forming the first layer of the thin film or in a case where the total amount of the cooling gas introduced is reduced when forming the first layer of the thin film, the substrate may not be adequately cooled down. Therefore, by decreasing the film deposition rate when forming the first layer of the thin film, the heat load applied to the substrate is reduced. If excessive heat load is applied to the substrate, the physical property of the substrate deteriorates. Therefore, when the cooling performance is low, it is preferable that the heat load applied to the substrate be reduced by reducing the film deposition rate.

The thin film formed by the present invention may be formed only by the thin film material or may be formed by the thin film material and oxygen. The latter case is preferable since the change in quality of the thin film is small even by the introduction of the oxygen as the cooling gas.

Advantageous Effects of Invention

In accordance with the thin film forming method of the present invention, the gas which reacts with the film forming material is introduced as the cooling gas. Therefore, even if the cooling gas leaks from between the cooling body and the substrate, all or a part of the leaked cooling gas reacts with, for example, the vapor of the film forming material in the vacuum chamber. With this, since the cooling gas is consumed and removed from the atmosphere, the deterioration of the degree of vacuum due to the introduction of the cooling gas can be suppressed. Therefore, the gas cooling necessary for the film formation at a high film formation rate can be realized at low cost using simple equipment while securing adequate cooling performance and suppressing the deterioration of the degree of vacuum and the reduction in quality of the thin film due to the deterioration of the degree of vacuum. In addition, in accordance with the present invention, the deterioration of the substrate and the reduction in quality of the thin film due to high reactivity of the introduced cooling gas can be prevented.

DESCRIPTION OF EMBODIMENTS

Hereinafter, embodiments of the present invention will be explained in reference to the drawings.

Embodiment 1

Figure 1:
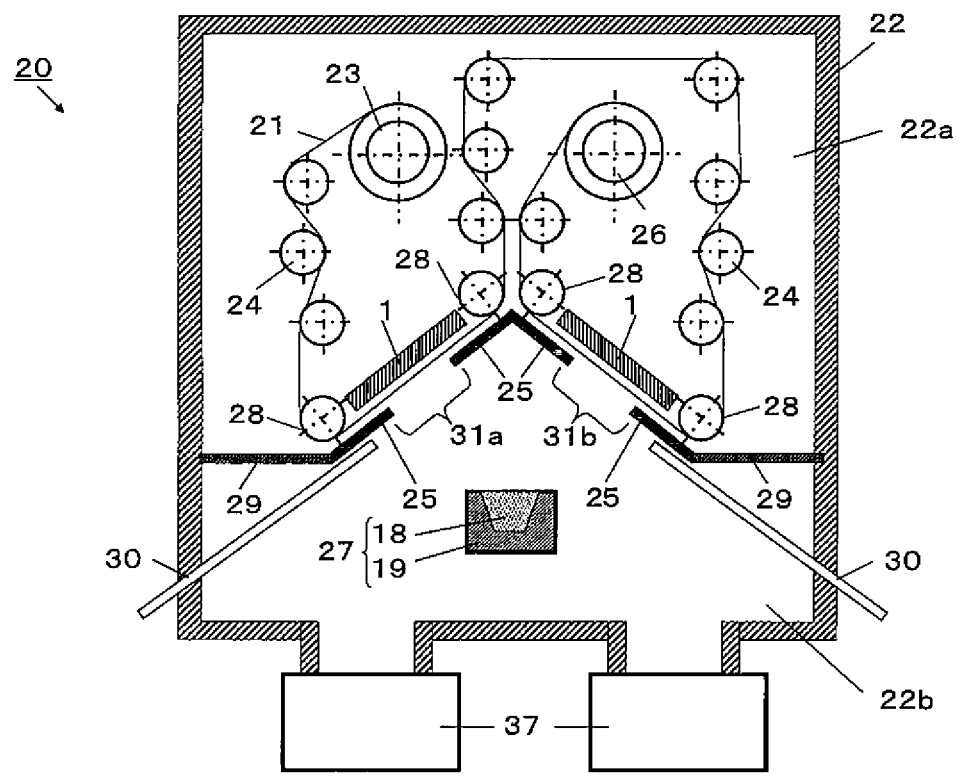
FIG. 1 is a configuration diagram of a film forming apparatus according to Embodiment 1 of the present invention.

FIG. 1 is a configuration diagram of a film forming apparatus 20 according to Embodiment 1 of the present invention. As shown in FIG. 1, the film forming apparatus 20 according to Embodiment 1 of the present invention is configured such that cooling bodies 1, a substrate 21, a first core roller 23, a plurality of feed rollers 24, a metal mask 25, a second core roller 26, a film forming source 27, shielding plates 29, and film forming reaction gas introduction tubes 30 are accommodated in an internal space of a vacuum chamber 22 that is a pressure-resistant container-like member.

Exhaust units 37 are externally provided under the vacuum chamber 22 to keep the inside of the vacuum chamber 22 in a pressure reduced state suitable for thin film formation. The exhaust units 37 are constituted by various vacuum exhaust systems, each including an oil diffusion pump, a cryopump, a turbo-molecular pump, or the like as a main pump. In Embodiment 1, two oil diffusion pumps each having a pump bore of 14 inches are included as the exhaust units 37. However, as with Embodiment 3 described below, separate exhaust units may be respectively connected to an upper space and lower space of the vacuum chamber 22.

The substrate 21 is a band-shaped elongated substrate, and examples of a material thereof are various metal foils, such as aluminum foils, copper foils, nickel foils, titanium foils, and stainless steel foils, various polymer films, such as polyethylene terephthalate, polyethylene naphthalate, polyamide, and polyimide, and a complex of the polymer film and the metal foil. The material of the substrate 21 is not limited to the above, and the band-shaped elongated substrate may be formed by using the other material.

In Embodiment 1, it is preferable that the substrate 21 be 50 to 1,000 mm in width and 3 to 150 µm in thickness. If the width of the substrate 21 is smaller than 50 mm, gas loss is large in a width direction of the substrate 21 during gas cooling. If the thickness of the substrate 21 is smaller than 3 µm, heat deformation of the substrate 21 tends to occur due to an extremely small heat capacity of the substrate 21. However, the present invention can be applied to both cases. A transfer speed of the substrate 21 differs depending on the type of the thin film to be formed and conditions for the film formation, but is set to 0.1 to 500 m/min in Embodiment 1. A tension applied in the traveling direction of the substrate 21 being transferred is suitably selected depending on the material and thickness of the substrate 21 and process conditions, such as the film formation rate (film deposition rate).

The first core roller 23, the second core roller 26, and the plurality of feed rollers 24 are roller-like members provided to be rotatable about corresponding shaft centers in the vacuum chamber 22. The substrate 21 on which the film is not yet formed winds around the first core roller 23, and the first core roller 23 supplies the substrate 21 to the closest feed roller 24. The plurality of feed rollers 24 guide the substrate 21, supplied from the core roller 23, to a region where the film formation is carried out and further guide the substrate 21, on which the film is formed in the middle of transfer, to the second core roller 26. The second core roller 26 can be rotated by a drive unit (not shown). The second core roller 26 takes up and stores the substrate 21 on which the film is formed. The feed rollers 24 are provided between a first opening 31a and a second opening 31b on a transfer passage of the substrate 21 so as to be located around the core roller 26 (inverted structure). With this configuration, a surface of the substrate 21 which surface faces the film forming source 27 can be inverted. Therefore, when the substrate 21 passes the first opening 31a, the deposition can be carried out on a front surface of the substrate 21. When the substrate 21 passes the second opening 31b, the deposition can be carried out on a rear surface of the substrate 21. Therefore, in accordance with the deposition apparatus 20, the deposited films can be continuously formed on both surfaces of the substrate 21 while maintaining the vacuum state in the vacuum chamber 22.

The metal mask 25 is formed at a center portion of the vacuum chamber 22 to have an inverted V shape. The metal mask 25 is provided parallel to the transfer passage of the substrate 21 so as to be close to a film formation surface (the front surface or the rear surface) of the travelling substrate 21. The first opening 31a and the second opening 31b are respectively formed at a center of a left wing portion of the metal mask 25 and a center of a right wing portion of the metal mask 25. Here, the front surface of the substrate 21 denotes a surface on which the film is formed while the substrate 21 passes the opening 31a of the metal mask 25 but is not formed while the substrate 21 passes the opening 31b of the metal mask 25. The rear surface of the substrate 21 denotes a surface on which the film is not formed while the substrate 21 passes the opening 31a of the metal mask 25 but is formed while the substrate 21 passes the opening 31b of the metal mask 25. The film forming source 27 is provided at a position opposed to a concave portion of the metal mask 25, that is, the film forming source 27 is provided in a space located on a vertically lower side of a lowermost portion of each of the openings 31a and 31b. One shielding plate 29 is joined to a lower end of the left wing portion of the metal mask 25 and an inner wall of the vacuum chamber 22, and another shielding plate 29 is joined to a lower end of the right wing portion of the metal mask 25 and the inner wall of the vacuum chamber 22. Thus, the internal space of the vacuum chamber 22 is divided into an upper space 22a and a lower space 22b. With this, a thin film forming region is formed in the lower space 22b of the vacuum chamber 22, and a region where deposition particles of a film forming material 18 emitted from the film forming source 27 contact the front surface or rear surface of the substrate 21 can be limited to the opening 31a or 31b. To be specific, the first opening 31a defines a first thin film forming region where the thin film is formed on the front surface of the substrate, and the second opening 31b defines a second thin film forming region where the thin film is formed on the rear surface of the substrate.

The film forming source 27 includes a container-like member 19 whose vertically upper portion opens and the film forming material 18 stored in the container-like member 19. A heating unit (not shown), such as an electron gun, is provided in the vicinity of the film forming source 27 to heat and evaporate the film forming material 18 in the film forming source 27. In Embodiment 1, an evaporation crucible is used as the container-like member 19. The film forming source 27 is not limited to the above, and various film forming sources may be used. For example, an evaporation source using resistance heating, induction heating, electron beam heating, or the like, an ion plating source, a sputtering source, or a CVD source may be used. Moreover, a combination of an ion source and a plasma source may be used as the film forming source 27.

In the lower space 22b of the vacuum chamber 22, film forming reaction gas introduction tubes 30 that are tubular members are respectively provided parallel to the left wing portion and right wing portion of the metal mask 25. Each of upper end portions of the film forming reaction gas introduction tubes 30 is positioned in a space located on a vertically upper side of the evaporation crucible 19 and is positioned lower than the lowermost portion of the opening 31a or 31b of the metal mask 25. Each of lower end portions of the film forming reaction gas introduction tubes 30 penetrates through the side wall of the vacuum chamber 22 to be connected to an external film forming reaction gas supplying unit (not shown), such as a gas bomb or a gas generator. A film forming reaction gas, such as oxygen or nitrogen, is suitably supplied from the film forming reaction gas supplying unit through the film forming reaction gas introduction tubes 30 to the vapor of the film forming material 18. With this, the deposition particles of the film forming material 18 emitted from the film forming source 27 react with the film forming reaction gas to become oxide, nitride, or oxynitride and adhere to the front surface or rear surface of the substrate 21. The adhered deposition particles are deposited to form the thin film on the front surface or rear surface of the substrate 21. In Embodiment 1, an oxygen gas is used as the film forming reaction gas. In the upper space 22a of the vacuum chamber 22, one cooling body 1 is provided between auxiliary rollers 28 to be close to a film non-formation surface of the traveling substrate 21, the auxiliary rollers 28 being respectively arranged on an upper side and lower side of the opening 31a of the metal mask 25, and another cooling body 1 is provided between auxiliary rollers 28 to be close to the film non-formation surface of the traveling substrate 21, the auxiliary rollers 28 being respectively arranged on an upper side and lower side of the opening 31b of the metal mask 25. A pair of auxiliary rollers 28 are provided on a front side and rear side of the cooling body 1 along the transfer passage of the substrate 21. The auxiliary rollers 28 contact the film non-formation surface of the substrate 21. With this, the transfer passage of the substrate 21 can be adjusted in the vicinity of the openings 31a and 31b, and a distance between the substrate and the cooling body can be finely adjusted.

The material of the cooling body 1 is not especially limited. Examples of the material of the cooling body 1 are metals, such as copper, aluminum, and stainless steel, which can secure a worked shape, carbon, various ceramics, and engineering plastics. Especially, it is preferable to use the metal, such as copper or aluminum, having high heat conductivity, since such metal is unlikely to generate dust and excels in heat resistance and the temperature of such metal is easily uniformized.

The cooling body 1 is cooled down by a cooling medium. The cooling medium is normally a liquid or a gas and is typically water. A cooling medium channel (not shown) is provided to contact the cooling body 1 or embedded in the cooling body 1. The cooling medium passes through this channel to cool down the cooling body 1. In the case of using a pipe as the cooling medium channel, the material of the pipe is not especially limited, and a copper pipe, a stainless steel pipe, or the like may be used. The pipe may be welded to the cooling body 1. Moreover, the cooling medium channel may be formed by directly forming on the cooling body 1a hole through which the cooling medium flows.

Hereinafter, the configuration of the cooling body 1 will be explained in detail in reference to FIGS. 2 and 3.

Figure 2:
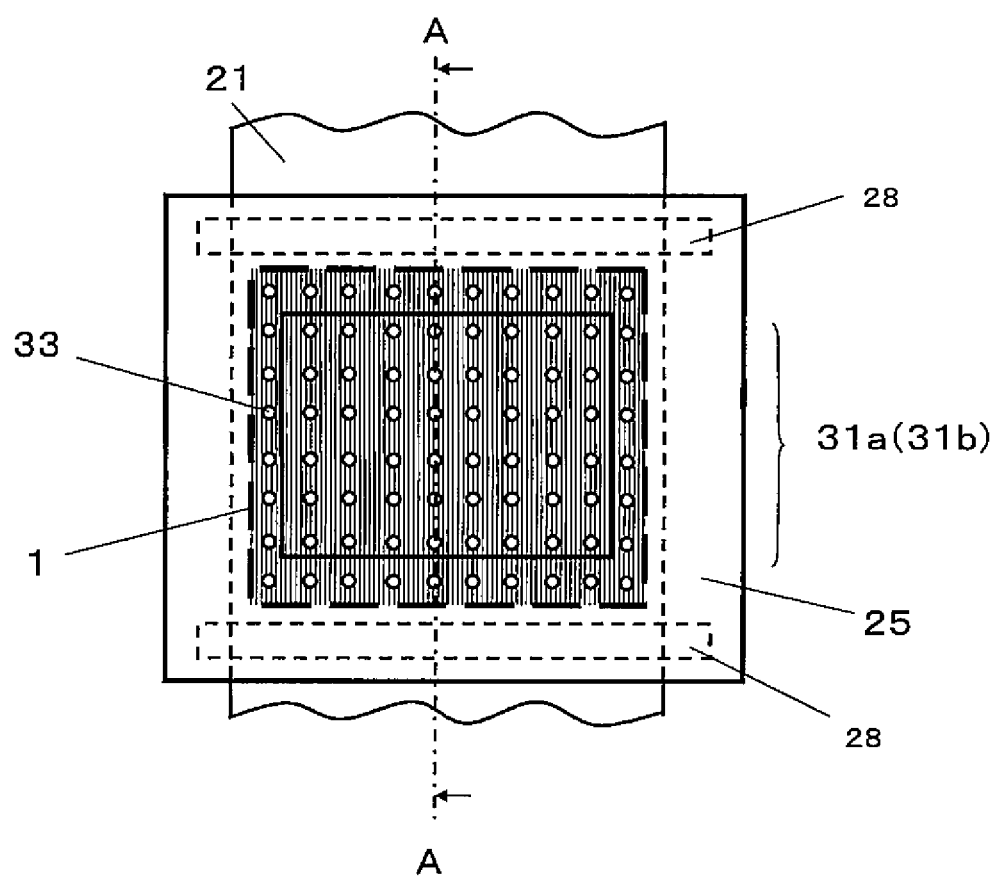
FIG. 2 is a perspective plan view of a cooling body of FIG. 1.
Figure 3:
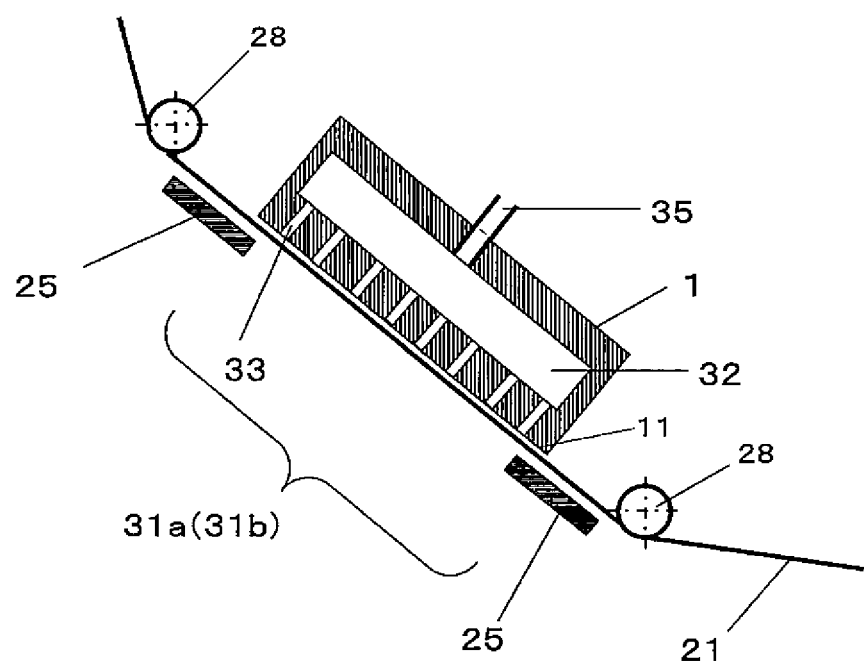
FIG. 3 is a cross-sectional view taken along line A-A of FIG. 2 and showing the cooling body

FIG. 2 is a perspective plan view of the cooling body 1 when viewed from the film forming source 27 toward the vicinity of the opening 31a or 31b in FIG. 1. FIG. 3 is a cross-sectional view taken along line A-A of FIG. 2 and showing the cooling body 1. As shown in FIGS. 2 and 3, the cooling body 1 includes a manifold 32, a large number of fine holes 33 extending from the manifold 32 to a cooling surface 11, and a cooling gas introducing port 35 connected to the manifold 32. The cooling gas introducing port 35 is connected to an external cooling gas supply source (not shown). The fine holes 33 connect the manifold 32 and the cooling surface (surface closer to the substrate 21) 11 of the cooling body 1. The area of the surface of the cooling surface 11 is larger than the area of each of the openings 31a and 31b of the metal mask 25. The cooling body 1 is provided such that the cooling surface 11 is opposed to the film non-formation surface of the substrate 21 and covers the entire opening 31a or 31b. When forming the thin film on the substrate 21, the cooling gas is introduced from the cooling gas supply source (not shown) through the cooling gas introducing port 35, the manifold 32, the fine holes 33, and the cooling surface 11 into between the cooling body 1 (or the cooling surface 11) and the substrate 21. The introduced gas transfers the cold of the cooling body 1 to the substrate 21 to cool down the substrate 21. Examples of the cooling gas supply source are a gas bomb and a gas generator. In Embodiment 1, used as the cooling gas is an argon gas (unreactive gas) and/or the oxygen gas (reactive gas) that is the same as the film forming reaction gas.

The temperature increase of the substrate 21 due to the radiation heat from the film forming source 27 and the heat energy of the deposition particles can be suppressed by cooling down the substrate 21 by the gas cooling. Therefore, the thin film can be stably formed.

Figure 4:
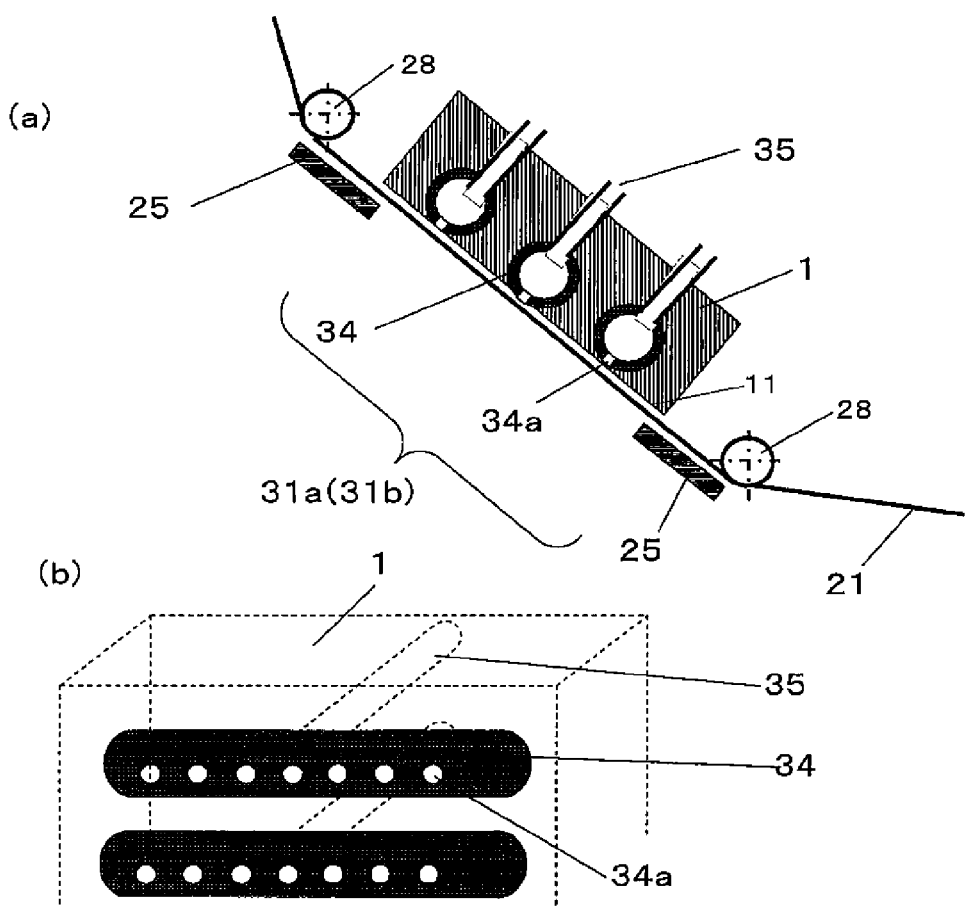
FIG. 4(a) is another configuration diagram of the cooling body of FIG. 1.
FIG. 4(b) is a perspective view of a gas nozzle of FIG. 4(a).
Figure 5:
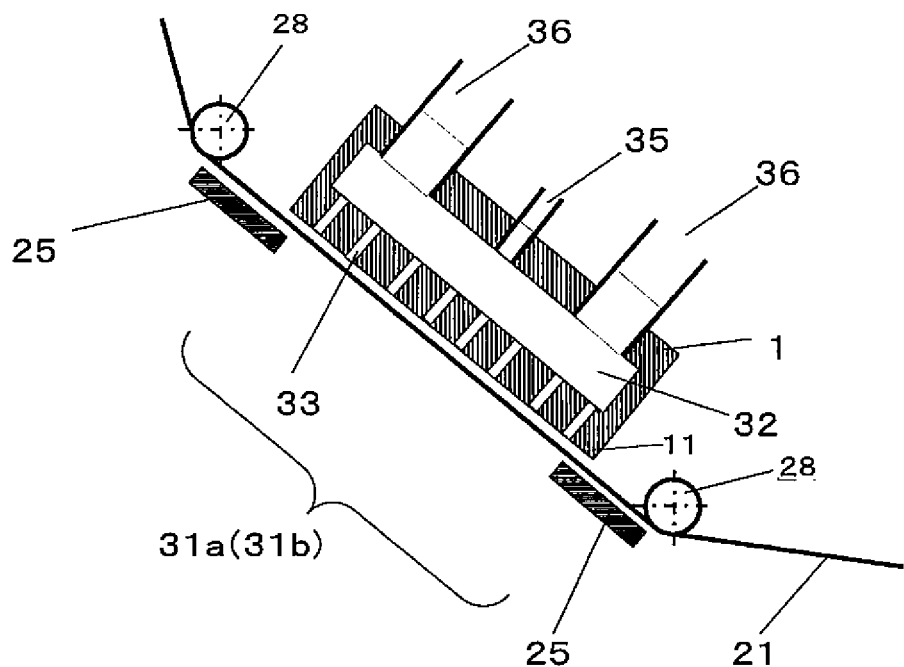
FIG. 5 is yet another configuration diagram of the cooling body of FIG. 1.

The configuration of the cooling body 1 is not limited to the above and may be the configuration shown in FIG. 4 or 5.

FIG. 4(a) is another configuration diagram of the cooling body 1 of FIG. 1. FIG. 4(b) is a perspective view of gas nozzles 34 of FIG. 4(a). As shown in FIGS. 4(a) and 4(b), a plurality of gas nozzles 34 each having a plurality of outlets 34a and a flute-like shape are embedded in the cooling body 1 and are respectively connected to a plurality of cooling gas introducing ports 35.

FIG. 5 is yet another configuration diagram of the cooling body 1 of FIG. 1. The cooling body 1 of FIG. 5 is different from the cooling body 1 of FIG. 3 in that two exhaust ports 36 are connected to the manifold 32 of the cooling body 1 so as to sandwich the cooling gas introducing port 35. With this, a part of the cooling gas remaining between the cooling body 1 and the substrate 21 can be suctioned. In accordance with the above configuration, the flow rate of the gas introduced into between the cooling body 1 and the substrate 21 can be increased under the same vacuum chamber pressure. Thus, the cooling efficiency can be further improved, and the temperature increase of the cooling gas can be suppressed. The gas introducing method is not limited to the above method, and any other method may be used as long as the cooling gas as a heat transfer medium can be controlled and introduced into between the cooling body 1 and the substrate 21.

In accordance with the thin film forming method of the present embodiment, a one-layer thin film or a multi-layer thin film can be formed on each of both surfaces of the substrate 21. To be specific, by carrying out the film formation while transferring the substrate 21 from the first core roller 23 toward the second core roller 26 as above, the one-layer thin film is formed on each of both surfaces of the substrate 21. Then, by inverting the transfer direction of the substrate 21 and forming the film again while transferring the substrate 21 from the second core roller 26 to the first core roller 23, a two-layer thin film is formed on each of both surfaces of the substrate 21. Thus, by repeatedly carrying out the film formation while inverting the transfer direction of substrate, a multi-layer thin film having an arbitrary thickness can be formed on each of both surfaces of the substrate 21.

Embodiment 2

Figure 6:
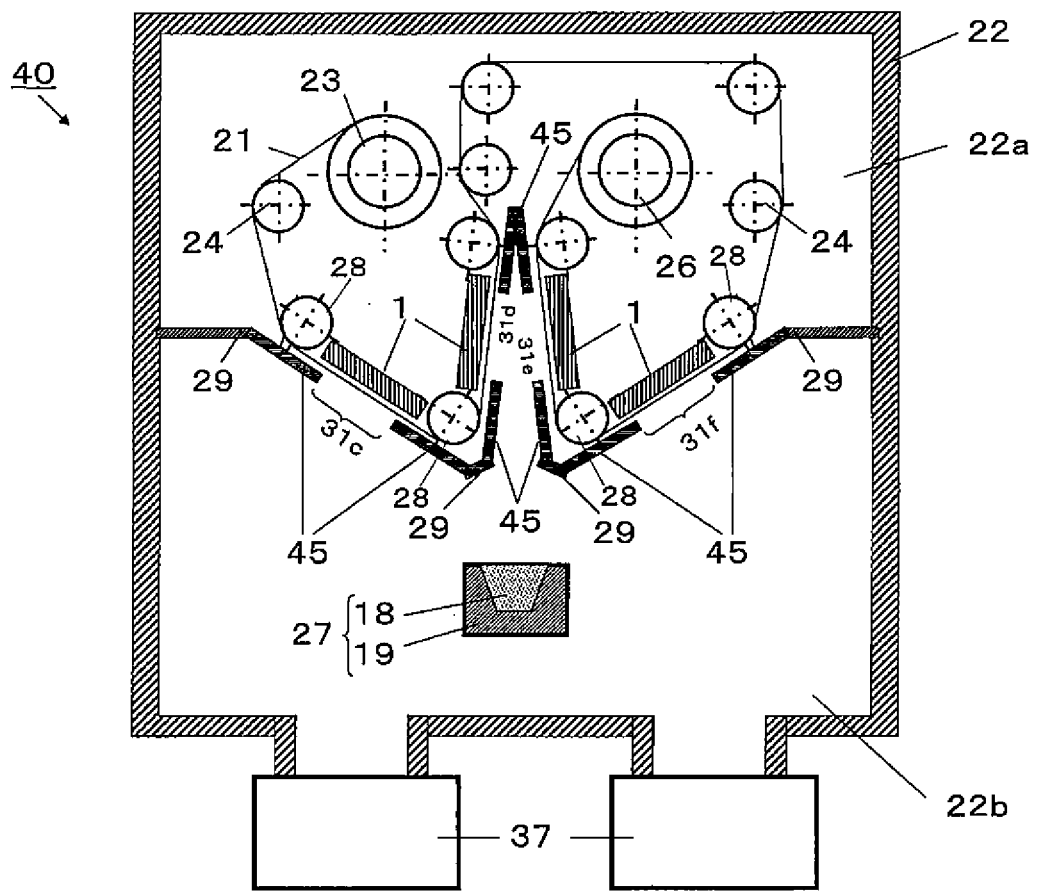
FIG. 6 is a configuration diagram of the film forming apparatus according to Embodiment 2 of the present invention.

FIG. 6 is a configuration diagram of a film forming apparatus 40 according to Embodiment 2 of the present invention. As shown in FIG. 6, the film forming apparatus 40 according to Embodiment 2 of the present invention is different from the apparatus shown in FIG. 1 in that the shape of a metal mask 45 is different, and openings 31c, 31d, 31e, and 31f of the metal mask 45 and the positions of the cooling bodies 1 are different. The same reference signs are used for the same components as in FIG. 1, and explanations thereof are omitted.

The metal mask 45 is formed at a center portion of the vacuum chamber 22 to have a substantially W shape. The metal mask 45 is provided parallel to the substrate 21 so as to be close to the film formation surface of the traveling substrate 21. A concave portion of a center portion of the metal mask 45 has a sharply-angled shape. Bottom portions of the sharply-angled shape are respectively joined to bottom portions of wing portions located on left and right sides of the concave portion by the shielding plates 29. Convex portions are formed on the left and right sides by two wing portions. Openings 31d and 31e are formed on the metal mask 45 at the same positions as in FIG. 1, and openings 31c and 31f are respectively formed at centers of the left and right wing portions. The cooling bodies 1 are respectively provided at the openings 31c, 31d, 31e, and 31f so as to be opposed to the film non-formation surface of the substrate 21. With this, the thickness of the film formed on each of both surfaces of the substrate 21 by one round trip of the substrate 21 can become about twice the thickness of the film formed by the film forming apparatus 20 of FIG. 1. Thus, the efficiency of the film formation can be increased.

Embodiment 3

Figure 7:
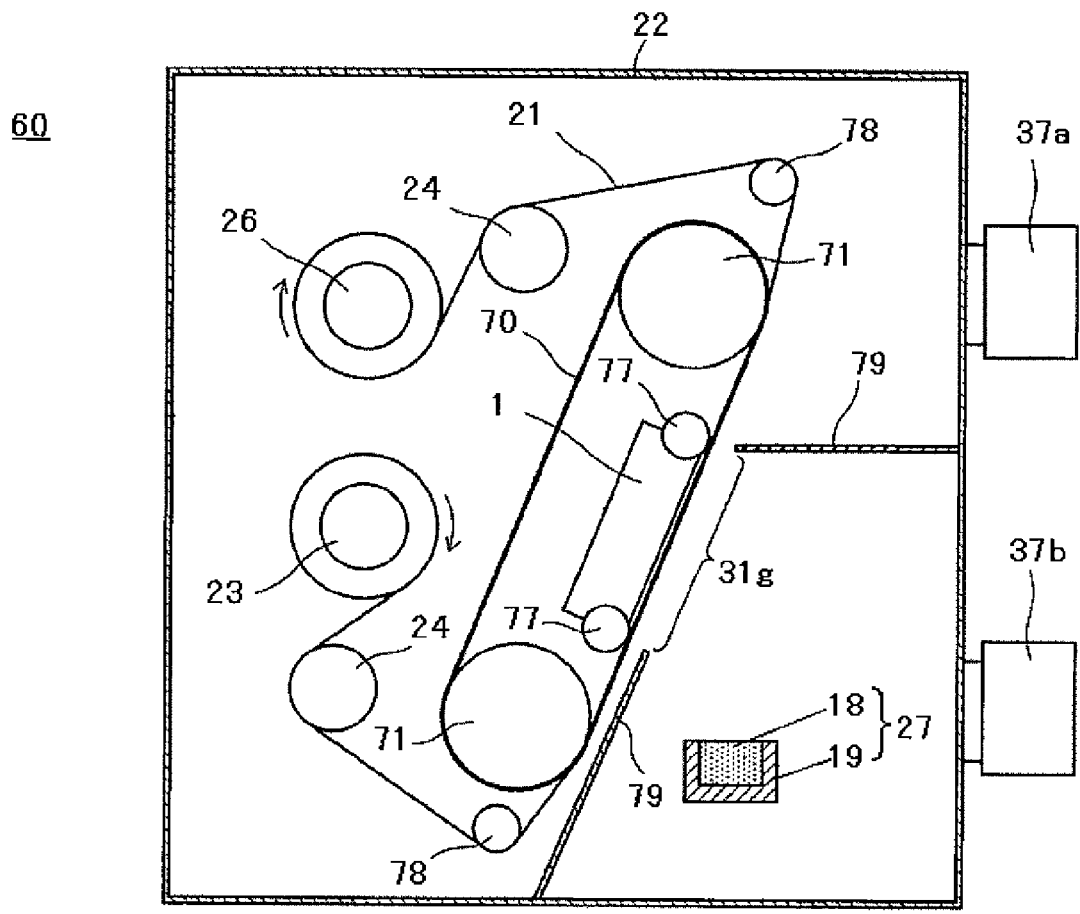
FIG. 7 is a configuration diagram of the film forming apparatus according to Embodiment 3 of the present invention.

FIG. 7 is a configuration diagram of a film forming apparatus 60 according to Embodiment 3 of the present invention. As shown in FIG. 7, in the film forming apparatus 60 according to Embodiment 3 of the present invention, the transfer passage of the substrate 21 in the vicinity of an opening 31g is defined by an endless belt 70. Moreover, exhaust units 37a and 37b are respectively connected to the upper space 22a and lower space 22b of the vacuum chamber 22 (however, as with Embodiment 1, the exhaust units may be connected to only the lower space 22b in Embodiment 3). Details will be explained below. The same reference signs are used for the same components as in FIG. 1, and explanations thereof are omitted.

A part of the transfer passage of the substrate 21 is defined by the endless belt 70 so as to extend along an outer peripheral surface of the endless belt 70. The endless belt 70 is provided to extend between the cooling surface 11 and the substrate 21. Through holes are formed on the endless belt 70 so as to extend in a thickness direction of the endless belt 70. When the cooling gas is supplied from the cooling surface 11 to between the cooling surface 11 and the endless belt 70, the cooling gas contacts the endless belt 70 and flows through the through holes of the endless belt 70 to be introduced into between the endless belt 70 and the substrate 21.

The substrate 21 is guided from the first core roller 23 through an upstream feed roller 24, an upstream auxiliary roller 78, the endless belt 70, a downstream gap adjustment roller 77, and a downstream auxiliary roller 78 to the second core roller 26. A pair of auxiliary rollers 78 are respectively provided upstream and downstream of the endless belt 70 along the transfer passage of the substrate 21. Each of the auxiliary rollers 78 is located on the transfer passage of the substrate 21 and at a position closest to the endless belt 70. With this, a tension can be applied to the substrate 21 to prevent a distance between the substrate 21 and the endless belt 70 from increasing too much. As a result, the substrate 21 is appropriately in close contact with the endless belt 70.

A shielding plate 79 is provided between the film forming source 27 and the endless belt 70. The thin film forming region on the surface of the substrate 21 is defined by the opening 31g of the shielding plate 79. A region which is not shielded by the shielding plate 79 is the thin film forming region on the surface of the substrate 21, the thin film forming region being a region to which the material particles from the film forming source 27 can reach.

The exhaust unit 37a is connected to the upper space 22a of the vacuum chamber 22, and the exhaust unit 37b is connected to the lower space 22b of the vacuum chamber 22. With this, the degree of vacuum in the upper space 22a and the degree of vacuum in the lower space 22b can be set to be different from each other. Therefore, to achieve excellent thin film quality, the degree of vacuum in the lower space 22b including the thin film forming region can be set to be lower than the degree of vacuum in the upper space 22a. Various vacuum pumps, such as oil diffusion pumps, cryopumps, and turbo-molecular pumps, can be used as the exhaust units 37a and 37b. In the case of introducing a helium gas as the cooling gas, the oil diffusion pump and the turbo-molecular pump are preferable. FIG. 7 shows the cryopump or the turbo-molecular pump.

The endless belt 70 will be explained in more detail.

As shown in FIG. 7, the endless belt 70 hangs between two cans 71 and travels by driving the cans 71 by a motor or the like. The transfer passage of the substrate 21 in the vicinity of the opening 31g is defined along the outer peripheral surface of the endless belt 70. A traveling speed of the endless belt 70 during the film formation is equal to the transfer speed of the substrate 21 by a substrate transfer mechanism including the core roller and the feed roller. However, as long as the substrate 21 is not damaged, the traveling speed of the endless belt 70 and the transfer speed of the substrate 21 may be slightly different from each other.

The material of the endless belt 70 is not especially limited. In light of the heat resistance, a metal, such as stainless steel, titanium, molybdenum, copper, or titanium, is excellent. The endless belt 70 has a thickness of, for example, 0.1 to 1.0 mm. The endless belt 70 having such thickness is unlikely to deform by the radiation heat and the heat of vapor flow during the film formation and is soft such that the can 71 having a comparatively small diameter can be used.

Moreover, the endless belt 70 may include a resin layer formed on an outer peripheral surface contacting the substrate 21. To be specific, a metal belt lined by resin may be used as the endless belt 70. When the resin layer having excellent flexibility is provided on the surface of the endless belt 70, the contact property between the endless belt 70 and the substrate 21 improves in a section where the endless belt 70 contacts the can 71. Therefore, the cooling efficiency of the substrate 21 based on direct contact between the endless belt 70 and the substrate 21 improves. Moreover, since the substrate 21 is less likely to slide on the endless belt 70, it is possible to prevent the rear surface of the substrate 21 from being damaged.

Moreover, to increase a contact portion between the endless belt 70 and the substrate 21, the substrate 21 may be attached to the endless belt 70 by utilizing electrostatic force.

The endless belt 70 is in close contact with the can 71 and is cooled down by the can 71. With this, the effect of cooling the substrate 21 based on the direct contact between the endless belt 70 and the substrate 21 can be improved.

A plurality of through holes are formed on the endless belt 70 so as to be lined up in a longitudinal direction (rotation direction) of the endless belt 70 at regular intervals. With this, the substrate 21 can be cooled down uniformly. Further, through holes are formed on the endless belt 70 along a plurality of columns in a width direction of the endless belt 70 at regular intervals. With this, the substrate 21 can be cooled down uniformly in both the longitudinal direction and the width direction. Therefore, uneven cooling is unlikely to occur on the surface of the substrate 21, and an adequate cooling effect for the substrate 21 can be achieved. However, the arrangement of the through holes is not limited to the above and can be suitably changed. Moreover, as the shape of the opening of the through hole, various shapes, such as a circle, a triangle, a square, and an oval, may be suitably adopted. A groove-like through hole may be formed. The number of columns of the through holes is not limited to 2 or 3 and may be four or more, or may be 20 or more depending on circumstances.

Moreover, as shown in FIG. 7, in the thin film forming device 60 of the present embodiment, gap adjustment rollers 77 configured to adjust the width of the gap between the endless belt 70 and the cooling body 1 are provided on the cooling surface 11 of the cooling body 1 so as to slightly project from the cooling surface 11. The width of the gap between the cooling surface 11 and the endless belt 70 can be maintained constant by the gap adjustment rollers 77 with high accuracy. As a result, it is possible to prevent the endless belt 70 from being damaged by the contact with the cooling surface 11. Moreover, if the gap between the cooling surface 11 and the endless belt 70 is extremely reduced, and the pressure in the gap is maintained, the cooling gas is easily introduced into the through holes. In this case, since the adequate cooling effect can be obtained by a small amount of cooling gas, it is advantageous to suppress the pressure increase in the vacuum chamber 22.

As the gap adjustment roller 77, a roller made of a metal, such as stainless steel or aluminum, may be used. The surface of the gap adjustment roller 17 may be formed by rubber or plastic. The diameter of the gap adjustment roller 17 is set, for example, in a range from 5 to 100 mm in order to obtain adequate strength and not to take too much installation space.

In accordance with the thin film forming method of the present embodiment, the one-layer thin film or the multi-layer thin film can be formed on one surface of the substrate 21. To be specific, by carrying out the film formation while transferring the substrate 21 from the core roller 23 to the core roller 26 as above, the one-layer thin film is formed on one surface of the substrate 21. Then, by inverting the transfer direction of the substrate 21 and forming the film again while transferring the substrate 21 from the core roller 26 to the core roller 23, the two-layer thin film can be formed on one surface of the substrate 21. By repeatedly carrying out the film formation while inverting the transfer direction of the substrate as above, the multi-layer thin film can be arbitrarily formed on one surface of the substrate 21.

Embodiment 4

Figure 8:
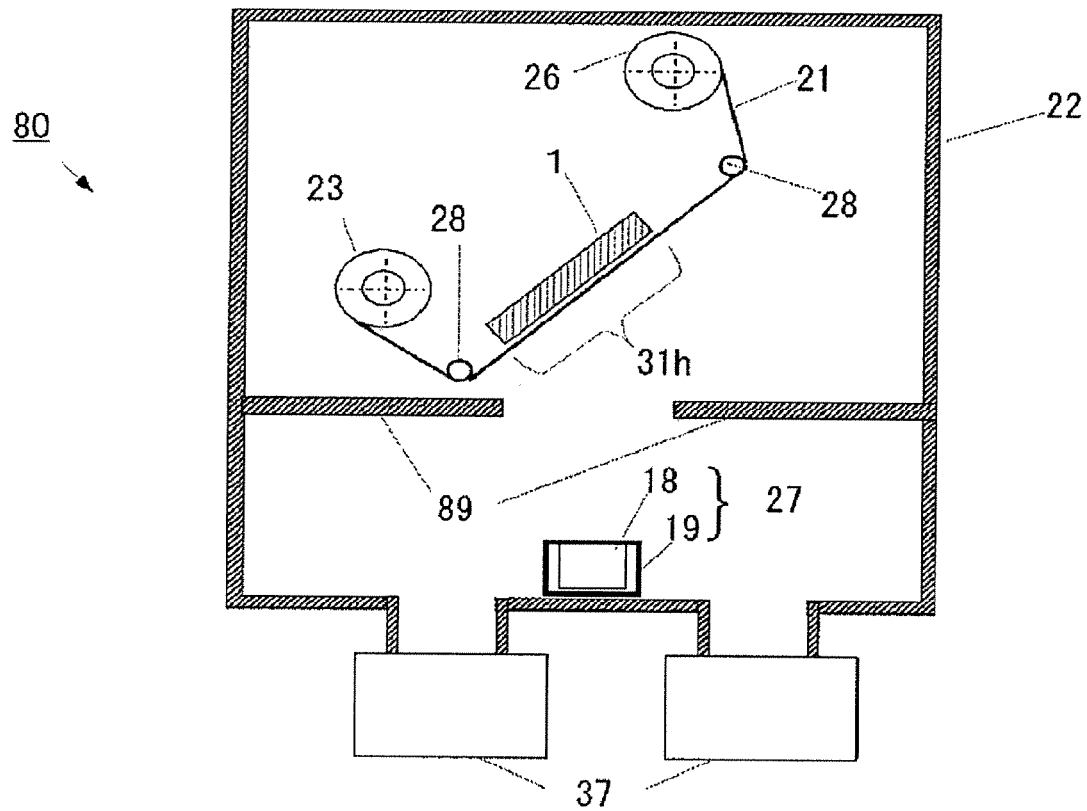
FIG. 8 is a configuration diagram of the film forming apparatus according to Embodiment 4 of the present invention.

FIG. 8 is a configuration diagram of a film forming apparatus 80 according to Embodiment 4 of the present invention. As shown in FIG. 8, the film forming apparatus 80 according to Embodiment 4 of the present invention is apparatus including only one opening and configured to form the film only on one surface of the substrate. The film forming apparatus 80 is different from that in FIG. 1 in that the inverted structure constituted by the feed rollers 24, the metal mask 25, the film forming reaction gas introduction tube 30, and the like are not included. The same reference signs are used for the same components as in FIG. 1, and explanations thereof are omitted.

A shielding plate 89 is provided between the film forming source 27 and the substrate 21. The thin film forming region on the surface of the substrate 21 is defined by an opening 31h of the shielding plate 89. A region which is not shielded by the shielding plate 89 is the thin film forming region on the surface of the substrate 21, the thin film forming region being a region to which the material particles from the film forming source 27 can reach.

In the present embodiment, since the film forming reaction gas introduction tube 30 is not used, only the film forming material 18 adheres to the surface of the substrate 21 to form the thin film. However, as with Embodiment 1, the thin film can be formed by, for example, the oxide of the film forming material 18 by using the film forming reaction gas introduction tube 30.

In accordance with the film forming apparatus 80 of Embodiment 4 of the present invention, the one-layer thin film can be formed only on one surface of the substrate 21. To be specific, by carrying out the film formation while transferring the substrate 21 from the first core roller 23 to the second core roller 26, the one-layer thin film is formed on one surface of the substrate 21.

Moreover, after one thin film is formed, the transfer direction of the substrate 21 is inverted, and the film formation is carried out again while transferring the substrate 21 from the second core roller 26 to the first core roller 23. With this, the two-layer thin film can be formed on one surface of the substrate 21. By repeatedly carrying out the film formation while inverting the transfer direction of the substrate as above, the multi-layer thin film having an arbitrary thickness can be formed on one surface of the substrate 21.

EXAMPLES

Next, as a specific example of the present invention, a method for forming a negative electrode of a lithium ion secondary battery will be explained. However, the present invention is not limited to these examples.

Example 1

In Example 1, a silicon multi-layer thin film having a thickness of about 8 μm was formed on each of both surfaces of a current collector by vacuum deposition using the film forming apparatus 20 shown in FIG. 1 based on Embodiment 1. Used as the substrate 21 of the current collector was a roughened copper foil (produced by Furukawa Circuit Foil Co., Ltd., Thickness of 18 μm, Width of 100 mm). Used as the film forming material 18 was silicon. The cooling body 1 was formed by aluminum. The length of the cooling surface 11 in the width direction of the substrate 21 was 90 mm. The substrate transfer mechanism of the film forming apparatus 20 can carry out the round trip of the substrate. By one-way trip, the substrate transfer mechanism can form a one-layer silicon thin film having a thickness of about 0.5 μm on each of both surfaces of the substrate 21. Therefore, in Example 1, by repeatedly carrying out a film forming step of the round trip 16 times on the basis that the one-way trip was counted as once, the silicon multi-layer thin film having a thickness of about 8 μm was stacked and formed on each of both surfaces of the substrate 21.

The cooling body 1 was provided in the vacuum chamber 22 having a volume of 0.4 m$^3$ so as to be spaced apart from the substrate 21 by about 1 mm. The cooling body 1 was cooled down by cooling water of 10° C. In order that the width of the thin film in the width direction of the substrate 21 became 85 mm, the metal mask 25 having the openings, each of which was 200 mm in length in the traveling direction and 85 mm in length in the width direction, was provided so as to be spaced apart from the substrate 21 by about 2 mm. In Example 1, the film forming reaction gas was not introduced.

After the pressure in the vacuum chamber 22 was reduced by the exhaust unit 37 up to 0.002 Pa, silicon was molten by a 270-degree deflection electron beam evaporation source (produced by JEOL Ltd.) that was the heating unit. The molten silicon was irradiated with an electron beam having an accelerating voltage of −10 kV and an emission current of 520 to 700 mA, and the generated vapor was supplied to the substrate 21 that was the copper foil.

The thin film formation of a first layer on each of both surfaces of the substrate 21 was carried out by the emission current of 520 mA, the substrate transfer speed of 0.8 m/minute, and the film deposition rate of 35 nm/second without introducing the cooling gas.

The thin film formation of second to sixteenth layers on each of both surfaces of the substrate 21 was carried out by an average emission current of 700 mA, the substrate transfer speed of 2.4 m/minute, and the film deposition rate of 100 nm/second. At this time, 120 sccm of the oxygen gas that was the cooling gas was introduced to each of two gaps between the cooling surface 11 and the substrate 21.

As above, in Example 1, high-temperature silicon deposition particles moved through the openings 31$a$ and 31$b$ of the metal mask 25 to adhere to the substrate 21. When carrying out the film formation of the second to sixteenth layers, the substrate 21 was cooled down by the cooling gas from the film non-formation surface side.

Influence on Degree of Vacuum

According to a vacuum gauge provided at a pipe passage extending to an intake port of an oil diffusion pump that was the exhaust unit 37, the degree of vacuum in the vacuum chamber 22 was 0.003 Pa when the melting of the silicon was terminated and a molten surface was stabilized, about 0.004 Pa when the first layer of the silicon multi-layer thin film was formed, and about 0.012 Pa when the second to sixteenth layers were formed.

In a case where the silicon was not molten, that is, the thin film formation was not carried out, and 120 sccm of the oxygen gas as the cooling gas was introduced into each of two gaps between the cooling surface 11 and the substrate 21 under the same vacuum condition, the degree of vacuum in the vacuum chamber 22 was about 0.082 Pa. It was found from the above that the deterioration of the degree of vacuum was suppressed by introducing the oxygen gas as the cooling gas during the thin film formation as compared to a case where the film formation was not carried out. This may be because the oxygen gas was consumed by the reaction between the floating silicon vapor and the introduced oxygen gas and this improves the degree of vacuum.

Influence on Substrate

The influence on the substrate that is the copper foil by the introduction of the oxygen gas as the cooling gas was examined by discoloration of the copper foil confirmed visually and a stress-stretch property. The stress-stretch property (S-S curve) was measured by pulling a copper foil test piece at a rate of 50 mm/min, the copper foil test piece including a narrow-width portion having a width of 6 mm and a length of 40 mm. The strength of the substrate used was about 10 N/mm before the application of the heat load. It was found that the strength of the copper foil substrate subjected to a temperature higher than 400° C. significantly deteriorated.

In a case where a large amount of oxygen gas as the cooling gas was introduced during the thin film formation of the first layer as with during the thin film formation of the second and subsequent layers, significant oxidative discoloration was confirmed on the film non-formed rear surface of the substrate at the substrate temperature of 200° C. or higher. In addition, it was found that the strength of the substrate deteriorated.

In contrast, in a case where the oxidation gas as the cooling gas was not introduced during the thin film formation of the first layer, the deterioration of the strength of the substrate regarding the stress-stretch property was not confirmed regardless of the cooling gas introducing condition for the second and subsequent layers.

Evaluation

In Example 1, since the film deposition rate when forming the first layer was about one third of the film deposition rate when forming the second to sixteenth layers, the heat load received by the substrate 21 that is the copper foil when forming the first layer was half the heat load or smaller when forming the second to sixteenth layers. On this account, even though the cooling gas was not introduced when forming the first layer, significant deterioration of the substrate 21 that was the copper foil due to the temperature increase did not occur. Moreover, since the oxygen gas as the cooling gas was introduced only when forming the second to sixteenth layers, the first layer was not oxidized and obtained a stable quality. Further, the heat load when forming the second to sixteenth layers was higher than the heat load when forming the first layer. However, since the cooling gas was introduced to adequately cool down the copper foil when forming the second to sixteenth layers, significant deterioration of the substrate 21 that was the copper foil due to the temperature increase did not occur.

Moreover, in Example 1, since the oxygen gas as the cooling gas was introduced only when forming the second to sixteenth layers, the deterioration due to the oxidation of the exposed surface of the substrate 21 that was the copper foil was prevented.

In Example 1, most of the oxygen gas for cooling reacted with the silicon vapor during the film formation to be removed from the space of the vacuum chamber 22. Therefore, the reduction in the degree of vacuum in the vacuum chamber 22 due to the introduction of the cooling gas was suppressed.

The deterioration of the copper foil due to the temperature increase can be evaluated by, for example, the change in a mechanical physical value by the above-described pulling test. The copper foil deteriorated by heat shows the increase in stretch by a pulling load, the reduction in breaking strength, and the like. Since the silicon thin film used in a polar plate of a lithium secondary battery expands when absorbing lithium, the deterioration of these properties leads to the deformation or breakdown of the polar plate.

Example 2

In Example 2, a silicon oxide multi-layer thin film having a thickness of about 15 μm was formed on each of both surfaces of the current collector by vacuum deposition using the film forming apparatus 40 shown in FIG. 6 based on Embodiment 2. Used as the substrate 21 of the current collector was a roughened copper foil (produced by Furukawa Circuit Foil Co., Ltd., Thickness of 18 μm, Width of 100 mm). Used as the film forming material 18 was silicon. The cooling body 1 was formed by aluminum whose surface was subjected to a black alumite treatment. The length of the cooling surface 11 in the width direction of the substrate 21 was 90 mm.

The substrate transfer mechanism of the film forming apparatus 40 can carry out round trip of the substrate. By one-way trip, the substrate transfer mechanism can form a one-layer silicon oxide thin film having a thickness of about 1 μm on each of both surfaces of the substrate 21. Therefore, in Example 2, by repeatedly carrying out the film forming step of the round trip 15 times on the basis that the one-way trip was counted as once, the silicon oxide multi-layer thin film having a thickness of about 15 μm was stacked and formed on each of both surfaces of the substrate 21.

The cooling body 1 was provided in the vacuum chamber 22 having a volume of 0.4 m$^3$ so as to be spaced apart from the substrate 21 by about 0.5 mm. The cooling body 1 was cooled down by the cooling water of 10° C. In order that the width of the thin film in the width direction of the substrate 21 became 85 mm, the metal mask 45 having the openings, each of which was 150 mm in length in the traveling direction and 85 mm in length in the width direction, was provided so as to be spaced apart from the substrate 21 by about 2 mm. In Example 2, before the silicon deposition particles adhered to the substrate 21 that was the copper foil, the silicon deposition particles were oxidized by introducing the oxygen gas into the openings 31 of the metal mask 45 from the film forming reaction gas introduction tube 30 provided on the film formation surface side of the substrate 21. With this, the thin film was formed by the silicon oxide.

After the pressure in the vacuum chamber 22 was reduced by the exhaust unit 37 up to 0.002 Pa, silicon was molten by the 270-degree deflection electron beam evaporation source (produced by JEOL Ltd.) that was the heating unit. The molten silicon was irradiated with the electron beam having the accelerating voltage of −10 kV and the emission current of 700 to 950 mA, and the generated vapor was supplied to the substrate 21 that was the copper foil.

The thin film formation of the first layer on each of both surfaces of the substrate 21 was carried out by the emission current of 700 mA and the substrate transfer speed of 1.8 m/minute. When the melting of the silicon was terminated and the molten surface was stabilized, 30 sccm of the oxygen gas as the film forming reaction gas was introduced from the film forming reaction gas introduction tube 30 (not shown) into each of the openings 31c, 31d, 31e, and 31f of the metal mask 45, and the thin film formation of the first layer was carried out by the film deposition rate of 100 nm/second. At the same time, 9 sccm of the argon gas as the cooling gas was introduced into each of four gaps between the cooling surface 11 and the substrate 21.

The thin film formation of the second to fifteenth layers on each of both surfaces of the substrate 21 was carried out by the average emission current of 950 mA, the substrate transfer speed of 3.6 m/minute, and the film deposition rate of 200 nm/second. At this time, 30 sccm of the oxygen gas as the film forming reaction gas was introduced from the film forming reaction gas introduction tube 30 into each of the openings 31c, 31d, 31e, and 31f of the metal mask 25. At the same time, 60 sccm of the oxygen gas and 9 sccm of the argon gas as the cooling gas were introduced to each of four gaps between the cooling surface 11 and the substrate 21.

As above, in Example 2, high-temperature silicon deposition particles oxidized by the oxygen gas as the film forming reaction gas passed through the openings 31c, 31d, 31e, and 31f of the metal mask 45 to adhere to the substrate 21. During the thin film formation of the first layer, the substrate 21 was cooled down by the argon gas from the film non-formation surface side. During the thin film formation of the second to fifteenth layers, the substrate was cooled down by the argon gas and the oxygen gas from the film non-formation surface side.

Influence on Degree of Vacuum

According to the vacuum gauge provided at the pipe passage extending to the intake port of the oil diffusion pump that was the exhaust unit 37, the degree of vacuum in the vacuum chamber 22 was 0.003 Pa when the melting of the silicon was terminated and the molten surface was stabilized, about 0.020 Pa when the first layer of the silicon oxide multi-layer thin film was formed, and about 0.028 Pa when the second to fifteenth layers were formed.

In a case where the silicon was not molten, that is, the thin film formation was not carried out, and 60 sccm of the oxygen gas and 9 sccm of the argon gas as the cooling gases were introduced under the same vacuum condition, the degree of vacuum in the vacuum chamber 22 was about 0.094 Pa.

It was found from the above that the deterioration of the degree of vacuum was suppressed by introducing the oxygen gas as the cooling gas during the thin film formation as compared to a case where the film formation was not carried out. This may be because the oxygen gas was consumed by the reaction between the floating silicon vapor and the introduced oxygen gas and this improves the degree of vacuum.

Influence on Oxidation Degree x

The change in an oxidation degree x of a thin film constituent material $SiO_x$ due to the introduction of oxygen when the film formation was carried out by the average film deposition rate of about 100 nm/s was confirmed. In a case where the oxygen gas was not introduced from a film forming reaction nozzle (the introduction amount was 0 sccm), the oxidation degree x was 0.22. However, in a case where 1,600 sccm of the oxygen gas was introduced from the film forming reaction nozzle, the oxidation degree x was 0.75. It was found from the above that the rate of rise of the oxidation degree x due to the introduction of the oxygen gas as the film forming reaction gas was 0.0331 per 100 scm of the film forming reaction gas.

In contrast, although the oxidation degree x was 0.22 in a case where the cooling gas was not introduced (the introduction amount was 0 sccm), the oxidation degree x was 0.23 in a case where 280 sccm of the oxygen gas was introduced as the cooling gas. It was found from the above that the rate of rise of the oxidation degree x due to the introduction of the oxygen gas as the cooling gas was 0.0036 per 100 scm of the cooling gas.

As above, the rate of rise of the oxidation degree x due to the introduction of the oxygen gas as the cooling gas was just about one tenth of the rate of rise of the oxidation degree x due to the introduction of the oxygen gas as the film forming reaction gas. Thus, the influence on the quality of the thin film due to the introduction of the oxygen gas as the cooling gas was extremely slight.

Moreover, after the formed thin film was heated (annealed) under an oxygen atmosphere of 0.1 Pa or lower, the oxidation degree x was measured. The oxidation degree x of the thin film obtained when the oxygen gas was introduced as the cooling gas and the oxidation degree x of the thin film obtained when the oxygen gas was not introduced as the cooling gas were substantially the same as each other. This also indicated that the quality of the thin film did not deteriorate due to the introduction of the oxygen gas as the cooling gas.

Evaluation

As above, in accordance with Example 2, the cooling gas having leaked from between the cooling surface 11 and the substrate 21 slightly increased the oxidation degree of the silicon oxide multi-layer thin film but did not significantly change the quality of the thin film, and the thin film was formed stably. The reason for this is not adequately clear, but the effect becomes larger if the gap between the metal mask 45 and the substrate 21 is narrower. To be specific, if the gap between the metal mask 45 and the substrate 21 is narrow, most of the cooling gas having leaked from between the cooling surface 11 and the substrate 21 does not flow to the lower space 22b of the vacuum chamber 22 but spreads in the upper space 22a of the vacuum chamber 22. Therefore, it is thought that before the cooling gas reaches the film formation surface of the substrate 21, most of the cooling gas is captured by the silicon vapor floating in a region other than the vicinity of the film formation surface of the substrate 21. As a result, it is thought that the increase in the oxidation degree of the silicon oxide multi-layer thin film formed on the substrate 21 is suppressed. Therefore, in Example 2, the oxidation degree of the silicon oxide multi-layer thin film is substantially determined by the oxygen gas introduced as the film forming reaction gas.

Moreover, in Example 2, since the film deposition rate when forming the first layer was half the film deposition rate when forming the second to fifteenth layers, the heat load received by the substrate 21 that was the copper foil when forming the first layer was significantly smaller than the heat load when forming the second to fifteenth layers. On this account, only a small amount of argon gas as the cooling gas was introduced when forming the first layer, and significant deterioration of the substrate 21 that was the copper foil did not occur. Moreover, since the oxygen gas as the cooling gas was introduced only when forming the second to fifteenth layers, the first layer was low in the oxidation degree and obtained a stable quality. Further, the heat load when forming the second to fifteenth layers was higher than the heat load when forming the first layer. However, since a comparatively large amount of cooling gas was introduced to adequately cool down the copper foil, significant deterioration of the substrate 21 that was the copper foil due to the temperature increase did not occur.

Moreover, in Example 2, since the oxygen gas as the cooling gas was introduced only when forming the second to sixteenth layers, the deterioration due to the oxidation of the exposed surface of the substrate 21 that was the copper foil was prevented.

In accordance with Example 2, most of the oxygen gas for cooling reacted with the silicon vapor during the film formation to be removed from the space of the vacuum chamber 22. Therefore, the reduction in the degree of vacuum in the vacuum chamber 22 due to the introduction of the cooling gas was suppressed.

Therefore, in accordance with the thin film forming method of the present invention, the oxygen gas that is the same as the film forming reaction gas is used as the cooling gas during the thin film formation of the second and subsequent layers. With this, even if the amount of cooling gas introduced into the vacuum chamber 22 is increased, the reduction in the degree of vacuum and the deterioration of the substrate can be suppressed. Thus, the stable thin film can be formed at low cost with high efficiency by using simple equipment.

As above, Examples 1 and 2 have explained the thin film forming method of the present invention. However, the present invention is not limited to this. The same effects as above can be obtained by the other thin film forming method using as the cooling gas a gas which reacts with the film forming material.

For example, the film is formed on the substrate transferred linearly. However, the present invention is not limited to this. Specifically, the film may be formed on the substrate 21 while causing the substrate 21 to travel along a cylindrical cooling can that is the cooling body 1. In this case, the cooling gas can be supplied through holes or grooves formed on the surface of the cylindrical cooling can.

Moreover, the argon gas and the oxygen gas are used as the cooling gas. However, the present invention is not limited to this. For example, an inactive gas, such as a helium gas, a neon gas, a xenon gas, or a krypton gas, or a hydrogen gas may be used as the cooling gas when and after forming the first layer. Moreover, various hydrocarbon gases and nitrogen gases may be suitably selected and used as the cooling gas when forming the first layer or as the cooling gas when forming the second and subsequent layers depending on the substrate material and the film forming material.

In the foregoing, the method for forming the negative electrode for the lithium ion secondary battery has been explained as one specific application example. However, the present invention is not limited to this. For example, a polar plate for an electrochemical capacitor can be formed by a similar configuration. In addition, the present invention is applicable to various fields, such as transparent electrode films, capacitors, decoration films, solar batteries, magnetic tape, gas barrier films, various sensors, various optical films, and hard protective membranes, which require high-speed stable film formation

INDUSTRIAL APPLICABILITY

In accordance with the thin film forming method of the present invention, even if the amount of cooling gas introduced for the gas cooling is increased, most of the cooling gas having leaked from between the cooling body and the substrate reacts with, for example, the vapor of the film forming material. Therefore, the cooling gas as the floating gas does not exist, and the deterioration of the degree of vacuum can be prevented. With this, the gas cooling necessary for the film formation at a high film formation rate can be realized at low cost using simple equipment while securing adequate cooling performance and suppressing the deterioration of the degree of vacuum and the reduction in quality of the thin film due to the deterioration of the degree of vacuum. In addition, the deterioration of the substrate and the reduction in quality of the thin film by the introduced cooling gas can be prevented.

REFERENCE SIGNS LIST 1 cooling body
18 film forming material
19 evaporation crucible
20, 40, 60 film forming apparatus
21 substrate
22 vacuum chamber
22a upper space
22b lower space
23 core roller A
24 feed roller
25, 45 metal mask
26 core roller B
27 film forming source
29 shielding plate
30 film forming reaction gas introduction tube
31a, 31b, 31c, 31d, 31e, 31f, 31g opening
32 manifold
33 fine hole
34 gas nozzle
34a outlet
35 cooling gas introducing port
36 exhaust port
37, 37a, 37b exhaust unit
70 endless belt
71 can
77 gap adjustment roller
78 auxiliary roller
79 shielding plate

The invention claimed is:

1. A method for depositing a film forming material in a vacuum on a substrate having a front surface and a rear surface to form a film, the method comprising:
   a first film forming step of forming a first layer of the film on the front surface of the substrate;
   a first cooling step of cooling down the substrate by introducing a first cooling gas to the rear surface during the first film forming step;
   a second film forming step of forming a second layer of the film on the first layer; and a second cooling step of cooling down the substrate by introducing a second cooling gas to the rear surface during the second film forming step, wherein:

an amount of a gas, which chemically reacts with the film forming material and the substrate in film forming conditions in the first and second film forming steps, in the first cooling gas is smaller than an amount of the gas in the second cooling gas, so as to suppress deterioration of the substrate caused by a chemical reaction between the gas and the substrate, the substrate is a metal foil, the gas which reacts with the film forming material contains oxygen, the film forming material used in the first film forming step is the same as the film forming material used in the second film forming step, and a heat load received by the substrate during the first film forming step is smaller than a heat load received by the substrate during the second film forming step.

2. The method according to claim 1, wherein:

the first cooling gas does not contain the gas which reacts with the film forming material.

3. The method according to claim 1, further comprising:

a third film forming step of forming the film on the rear surface of the substrate; and a third cooling step of cooling down the substrate by introducing a third cooling gas to the front surface during the third film forming step, wherein:

the third cooling gas contains the gas which reacts with the film forming material.

4. The method according to claim 3, wherein the first layer of the film is formed on each of both surfaces of the substrate, and then the second layer of the film is formed on each of both the first layer.

5. The method according to claim 1, wherein a film deposition rate when forming the first layer of the film is lower than a film deposition rate when forming the second layer of the film.

6. The method according to claim 1, wherein a total amount of the first cooling gas introduced when forming the first layer of the film is smaller than a total amount of the second cooling gas introduced when forming the second layer of the film.

7. The method according to claim 1, wherein the film contains the film forming material and oxygen.

8. The method according to claim 1, wherein the first cooling gas is constituted by only an unreactive gas, or contains the unreactive gas at more than 95 volume %, in which the unreactive gas does not chemically react with the film forming material and the substrate in the film forming conditions in the first and second film forming steps.

9. A method for depositing a film forming material in a vacuum on a substrate having a front surface and a rear surface to form a film, the method comprising:

a first film forming step of forming a first layer of the film on the front surface of the substrate while no cooling gas is introduced to the rear surface;

a second film forming step of forming a second layer of the film on the first layer; and a cooling step of cooling down the substrate by introducing a first cooling gas which contains a gas, which chemically reacts with the film forming material and the substrate in film forming conditions in the first and second film forming steps, to the rear surface during the second film forming step, so as to suppress deterioration of the substrate caused by a chemical reaction between the gas and the substrate in the first film forming step, wherein:

the substrate is a metal foil, the gas which reacts with the film forming material contains oxygen, the film forming material used in the first film forming step is the same as the film forming material used in the second film forming step, and a heat load received by the substrate during the first film forming step is smaller than a heat load received by the substrate during the second film forming step.

10. The method according to claim 9, further comprising:

a third film forming step of forming the film on the rear surface of the substrate; and a third cooling step of cooling down the substrate by introducing a second cooling gas to the front surface during the third film forming step, wherein:

the second cooling gas contains the gas which reacts with the film forming material.

11. The method according to claim 9, wherein a film deposition rate when forming the first layer of the film is lower than a film deposition rate when forming the second layer of the film.

12. The method according to claim 10, wherein the first layer of the film is formed on each of both surfaces of the substrate, and then the second layer of the film is formed on each of both the first layer.

* * * * *